United States Patent [19]

Kalfus et al.

[11] 4,117,351

[45] Sep. 26, 1978

[54] TRANSISTOR SWITCHING CIRCUIT

[75] Inventors: Martin Aaron Kalfus, Morganville; Dale Milton Baugher, Flemington, both of N.J.

[73] Assignee: RCA Corporation, New York, N.Y.

[21] Appl. No.: 783,221

[22] Filed: Mar. 31, 1977

[51] Int. Cl.² ................................. H03K 17/72
[52] U.S. Cl. ........................ 307/252 C; 307/254; 307/315
[58] Field of Search .............. 307/252 C, 253, 254, 307/315

[56] References Cited

U.S. PATENT DOCUMENTS 3,210,617  10/1965  Kruper ........................ 307/315 X

*Primary Examiner*—John Zazworsky
*Attorney, Agent, or Firm*—H. Christoffersen; Allen LeRoy Limberg; John M. O'Meara

[57] ABSTRACT

A first transistor is responsive to a control signal, for turning-on to conduct current to the base of a second transistor, for turning-on the second transistor for conducting a relatively high-magnitude range of current up to a predetermined limited magnitude of current. If the current reduces to below the high-magnitude range, the first transistor turns off, and the second transistor is responsive to the control signal for continuing conduction through its main current path of a relatively low-magnitude range of current with a relatively low value of voltage thereacross.

12 Claims, 4 Drawing Figures

TRANSISTOR SWITCHING CIRCUIT

The present invention relates to switching circuits, and more specifically, relates to a switching circuit capable of responding to a relatively low magnitude control current, for initially conducting a relatively high-magnitude range of current, up to a predetermined limited magnitude, in one state of operation, a relatively low magnitude range of current with a relatively low voltage drop across the switching circuit in another state of operation, and no current in an off state. In a Darlington circuit, a driver transistor is responsive to current supplied to its base electrode, for conducting current through its main current path to the base electrode of an output transistor. The present inventors recognized that a pair of transistors configured as a Darlington circuit can be applied for conducting a high-magnitude current via the main current path of the output transistor, in response to a relatively low-magnitude control current driven into the base of the driver transistor. They also recognized that when the magnitude of current flowing through the main current path of the output transistor reduced to within the relatively low-magnitude range, the voltage drop across this main current path is proportionately decreased to a level insufficient for maintaining the flow of current through the main current path of the driver transistor. This causes the Darlington circuit to, in effect, turn-off, preventing the circuit from conducting a relatively low-magnitude of current through the main current path of the output transistor with a relatively low voltage drop thereacross.

A switching circuit embodying the present invention comprises first and second transistors connected in a "tapped" Darlington configuration. The first transistor responds to a control signal, for turning on to conduct current to the base of the second transistor, the combination acting as a Darlington pair for conducting current in the high range to the limited magnitude. In the low-magnitude range, the first transistor is turned off, and the second transistor is responsive to the control signal, applied to its base electrode, for continuing conduction of current with a relatively low voltage drop across its collector-emitter electrodes. A representative application for such a switching circuit is to turn off a gate-turn-off silicon controlled rectifier.

Figure 1:
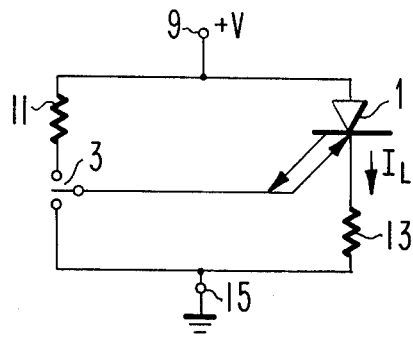
FIG. 1 is a circuit schematic diagram of a prior-art circuit for operating a gate-turn-off silicon controlled rectifier.

In FIG. 1, the gate-turn-off silicon controlled rectifier 1 (hereinafter referred to as a GTO) is turned on by operating switch 3 to complete a conduction path between power terminal 9 and the gate electrode of GTO 1. Terminal 9 is receptive of an operating voltage +V, and completion of the conduction path through resistor 11 and switch 3 delivers current to the gate electrode of GTO 1, to turn GTO 1 on. When GTO 1 is so turned-on, the relative resistance of its main conduction path between its anode and cathode electrodes is substantially decreased, permitting current $I_L$ to flow from terminal 9 through the main conduction path between the anode-cathode electrodes of GTO 1 to the load 13. Once a GTO is turned on via the application of a turn-on signal at its gate electrode, the turn-on signal can be removed without interrupting conduction through the main conduction path. This is a characteristic of the GTO and other devices such as SCR's included in the family of devices known as thyristors. Accordingly, in the normal operation of this circuit, after GTO 1 has been turned on, switch 3 can be returned to its neutral state, leaving the gate of GTO 1 unconnected.

The GTO 1 is turned-off by operating switch 3 to close the conduction path between the gate electrode of GTO 1 and a source of reference potential connected to terminal 15, ground, in this example. In this circuit state, a substantial portion of the current flowing through the anode electrode of GTO 1 is diverted from the cathode electrode to the gate electrode and ground. The gate current flowing to ground rapidly diminishes in value as the GTO 1 turns off, reducing to substantially zero magnitude at turn-off of GTO 1. Where, as in this example, GTO 1 has a cathode load 13, at the lower values of the gate-turn-off current, the diminishing voltage across the load 13 causes the load 13 to act as a battery, assisting in supplying turn-off current and reverse biasing the cathode-gate junction of GTO 1.

With presently available GTO's, just as turn-off of the GTO is attained, the gate electrode must be clamped to a level of voltage that is within about 0.25 volt of the voltage at the cathode electrode (ground, in the case of GTO 1), to ensure complete turn-off, or the GTO may turn on again. Also, the initial turn-off current flowing from the gate electrode of the GTO may be as high as 80% of the load current $I_L$ for a period of from 10 to 20 microseconds. In certain applications it is desirable to limit the peak magnitude of this turn-off current to prevent damage to the GTO. As indicated, this reverse gate current (Igq) rapidly decays, and at turn-off of GTO 1 only a relatively small leakage current flows from the anode to the gate electrode to ground.

Figure 2:
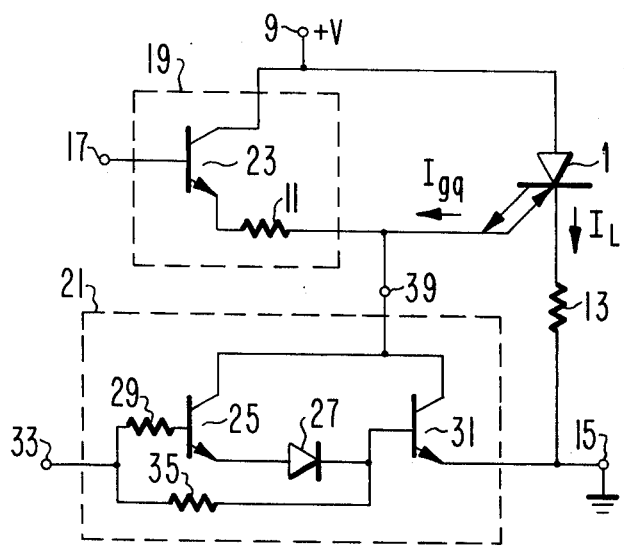
FIG. 2 is a schematic diagram of one embodiment of the present invention used in a circuit for operating a gate-turn-off silicon controlled rectifier.

In FIG. 2, electronic switching circuits 19, 21 are substituted for switch 3 and used respectively to turn on and turn off the GTO 1. A pulse is applied to turn-on terminal 17 for operating a turn-on circuit 19, for applying a signal to the gate of GTO 1, for turning on this GTO. A transistor 23, for example, can serve as the turn-on control device. When transistor 23 is so turned-on, by the application of a positive pulse to terminal 17, the operating voltage +V is applied to the end of the resistor 11 remote from the end connected to the gate electrode of GTO 1. Accordingly, current flows through resistor 11 into the gate electrode of GTO 1, turning on GTO 1 to conduct current $I_L$ to load 13.

In FIG. 2, transistor 24, diode 27, and resistor 29, might be omitted and the transistor 31 and resistor 35 alone used to turn-off GTO 1. To this end a positive-going turn-off signal would be applied to terminal 33, for turning on transistor 31, causing the impedance between its collector and emitter electrodes to be substantially reduced, thereby effectively connecting the gate electrode of GTO 1 to ground. If the magnitude of the load current $I_L$ is substantially high, say about 30 amps, anywhere from about 12 to 24 amperes of negative gate current, for example, may flow from the gate electrode of GTO 1 into current input terminal 39 and through transistor 31 to ground. Although this relatively high negative gate current rapidly decays, as previously described, the transistor 31 must be capable of conducting such a high-level surge current without damage, and at a very low collector-emitter saturation voltage. The transistor 31 must also be capable of clamping the gate to about 0.2 volt, for ensuring that the GTO is not turned back on. The use of a single transistor for so-turning off a GTO is known in the prior art, but such a transistor must be driven with a relatively high base current to ensure that its main conduction path conducts the initially relatively high-magnitude gate current from GTO 1, in turning off the GTO. In many applications, signal circuits for providing the initially relatively high current base drive to the transistor are not available, or uneconomical to provide. Such an application might include, for example, an automotive ignition system controlled by a microprocessor.

The present inventors have found that two transistors 25, 31 can be combined to provide composite switching circuit 21, as shown in FIG. 2. The composite switching circuit 21 can be either fabricated from discrete components or in integrated circuit form. As shown, the transistors 25, 31 are arranged in a Darlington like configuration, with the output transistor 31 having a "tapped" base electrode connected to terminal 33 via the resistor 35. Diode 27 is included to ensure proper biasing of transistor 31 via current flowing through resistor 35, by blocking the flow of any portion of this current from resistor 35 through the conduction path between the collector-emitter electrodes of transistor 25, during reverse beta operation of the latter, as will be explained.

Figure 3:
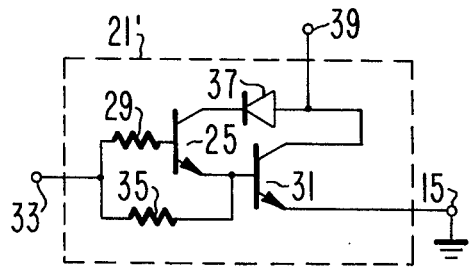
FIG. 3 is a schematic diagram of an alternative embodiment of the present invention.

Alternatively, as shown in FIG. 3, diode 37 can be substituted as shown in the collector circuit of transistor 25, and diode 27 eliminated, diode 37 serving the same purpose as diode 27. At present it is easier to fabricate switching circuit 21 in integrated circuit form, than circuit 21'. However, by judicious selection of transistors 25 and 31, and the values of resistors 29 and 35, for a particular magnitude of load current $I_L$ and a particular GTO 1, the diode 27 and diode 37 alternative, can be eliminated, but this does not lend itself well to mass production.

The value of bias resistor 29 is chosen in consideration of a predetermined value of a positive voltage applied to input terminal 33, for turning on transistor 25 to conduct current to transistor 31, for turning on transistor 31 to conduct a relatively high-magnitude range of current from terminal 39, and limit the maximum value of current conducted by the main current path of transistor 31 to a value $I_{MAX}$. The value of bias resistor 35 is chosen in consideration of a predetermined value of the positive voltage applied to input terminal 33, for turning on or continuing the conduction of transistor 31 for conducting a relatively low-magnitude range of current with a relatively low voltage drop across its collector-emitter electrode.

Alternatively, of course, turn-off might be controlled by two simultaneously switched constant current sources, the one supplying base current to transistor 25 in place of resistor 29 and the other supplying base current to transistor 31 in place of resistor 35. These current sources might be provided, for example, from the respective collector electrode of PNP bipolar transistor arranged to be simultaneously switched into and out of conduction, or selectively switched into and out of conduction.

Figure 4:
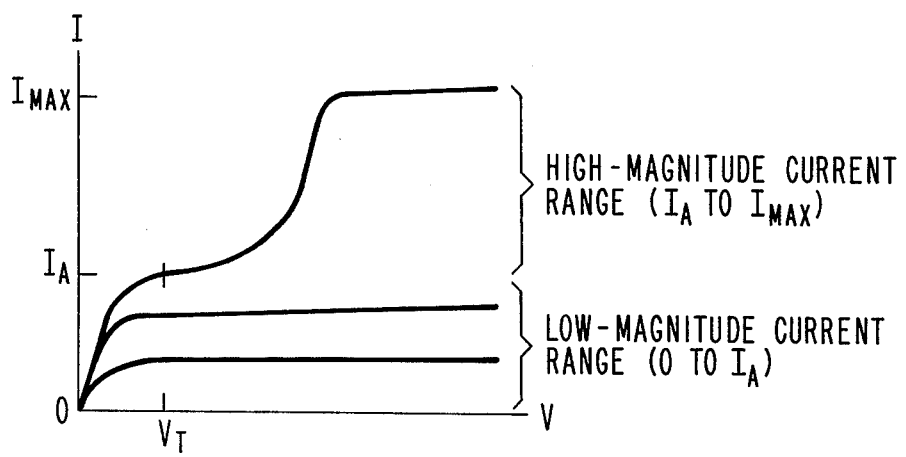
FIG. 4 is illustrative of the current-voltage characteristic operating curve for the embodiment of the invention of FIG. 2.

In FIG. 4, the operating curve for the composite switching circuits 21, 21' of FIGS. 2 and 3, respectively, shows that when a current source is connected to terminal 39, and the predetermined input signal is applied to input terminal 33, that for values of current in the range $I_A$ to $I_{MAX}$, both transistor 25 and 31 are turned on, the combination operating as a Darlington circuit. In this range of operation, the current being supplied to the base of transistor 31 via resistor 35 has substantially no effect upon the operation of transistor 31, for the current being supplied thereto from transistor 25 is substantially greater in magnitude. However, the current flow through the main current path of transistor 31 is limited to the base current of transistor 25 multiplied by the product of the current gains $\beta_{25}$ and $\beta_{31}$ for the transistors 25 and 31. Consequently, the maximum current $I_{MAX}$ being supplied from terminal 39 during such Darlington operation is limited in magnitude, to the limited capability of transistor 31. In the low magnitude current range from 0 to $I_A$, transistor 25 is turned-off and transistor 31 is turned on via the flow of current through resistor 35, for conducting this low-magnitude range of current, with a voltage drop across its collector-emitter electrodes of about 0.2 volt. In the high-magnitude current range, the voltage drop $V_{CE31}$ across the collector-emitter electrodes of transistor 31 is greater than that across the series circuit of the main current path of transistor 25, diode 27 (for switching circuit 21) or diode 37 (for 21'), and the base-emitter electrodes of transistor 31, necessary for maintaining transistor 25 in conduction (this value is $V_T$ in FIG. 4). If the current supplied to terminal 39 reduces to just below $I_A$, the voltage $V_{CE31}$ is less than $V_T$, and transistor 25 turns off. Without the use of diodes 27 or 37, if the current supplied to terminal 39 reduces below $I_A$ towards 0 magnitude, the voltage polarity across the collector-emitter electrodes of transistor 25 reverses, i.e. positive at the emitter, negative at the collector. Transistor 25 may go into inverse-beta operation, with its collector acting as an emitter, and its emitter as a collector, causing its collector-emitter current path to conduct a portion of the current being supplied to the base of transistor 31, from this base electrode to the collector electrode of transistor 31. Such inverse-beta operation of transistor 25 upsets the biasing of transistor 31 in the low-magnitude current range, and may prevent $V_{CE31}$ from reducing to below 0.25 volt, a necessary condition for completing turn-off of a GTO, for example. The inclusion of diodes 27 and 37 in 21, 21', respectively, blocks this shunting of base current from transistor 31, during inverse-beta operation of transistor 25, for the diodes 27, 37 are reverse biased at such times.

The switching circuits 21, 21' require only a relatively low-magnitude of current to be supplied to input terminal 33 in both the high-magnitude current range and the low-magnitude current range. In the high-magnitude current range, the switching circuits 21, 21' each operate as a Darlington circuit, and each require a maximum value of base current supplied to transistor 25 equal to $I_{MAX}$ divided by the product of the current gains ($\beta_{25}$, $\beta_{31}$) of transistors 25 and 31. In the low-magnitude current range, the maximum value of drive current required to be supplied to terminal 33 is equal to $I_A$ divided by $\beta_{31}$. Accordingly, assuming that $\beta_{25}$ and $\beta_{31}$ are each 30, and that $I_{MAX}$ is about 30 amperes, only about 33 milliamperes of current must be supplied to the base of transistor 25, for conduction by transistor 31 of the 30 ampere magnitude of current. In the high-magnitude current range, as the current decreases below $I_{MAX}$, proportionately less base current drive is required at transistor 25. If $I_A$ is assumed to have a magnitude of 1 ampere, then in the low-magnitude current range, only about 33 milliamperes need be supplied to the base of transistor 31, and proportionately less as the current decreases below $I_A$ toward zero. Accordingly, the present transistor switching circuits 21, 21' can be applied for use in systems where only low current signal sources are available for operating the switching circuit.

In FIG. 2, the composite transistor switching circuit 21 is shown applied for use as a turn-off circuit for turning-off the GTO 1. In operation, as previously described, the GTO 1 is turned on by applying a turn on signal to terminal 17, for turning on transistor 23 for applying a positive voltage to the gate electrode of the GTO 1. Once turned on, the GTO 1 will remain in conduction after the turn-on signal is removed from terminal 17, causing transistor 23 to turn off. To turn-off GTO 1, a turn-off signal is applied to terminal 33 of the composite switching circuit 21, causing transistor 25 to turn on for supplying current to the base of transistor 31. In response to the current supplied to its base electrode, transistor 31 will turn on quickly to conduct a substantially high-magnitude of current from the gate of GTO 1 to terminal 15, connected to a source of reference potential (ground in this example). The biasing of transistor 31 at this time, is such that the current drawn from the gate of the GTO 1 will be limited to a magnitude $I_{MAX}$. As previously described, the initial surge of the relatively high-magnitude current drawn from the gate electrode of the GTO 1 will rapidly diminish in magnitude as the GTO 1 begins turning-off. When such turn-off current from the gate electrode of the GTO 1 decreases to a value below $I_A$, the voltage across the main current path of transistor 31 will decrease to a value that will cause transistor 25 to turn off, as previously described. At this time, transistor 31 continues to conduct current in the low-magnitude current range, in response to the base current being supplied to it via resistor 35. As the negative gate current or turn-off current being drawn from the gate electrode of GTO 1 continues to decrease in value, the transistor 31 conducting this current through its main current path, continues to proportionately decrease the voltage across its current path to a relatively low value of about 0.2 volt. When the GTO 1 completes its turn-off, the gate current Igq of GTO 1 flowing through transistor 31 will decrease to substantially zero magnitude, and the transistor 31 will serve to clamp the gate electrode of GTO 1 to about 0.2 volt, ensuring that GTO 1 cannot turn back on. The turn-off signal applied to terminal 33 may now be removed, since the turn off of the GTO 1 is now complete. The composite switching circuit 21 (or 21') is also operative to turn off GTO 1 if the cathode electrode of GTO 1 is directly connected to terminal 15, and load 13 is relocated, for example, between terminal 9 and the anode electrode of GTO 1.

The composite transistor switching circuits 21, 21' of FIGS. 2 and 3, respectively, can be used in applications other than turning off a GTO. For example, the composite switching circuits 21, 21' may be useful in discharging capacitors or inductors, and in other applications where it is required that an initial high but limited magnitude of current be conducted during one state of operation of the switching circuit, and in another state of operation of the switching circuit a relatively low magnitude of current be conducted with a substantially low value of voltage existing across the switching circuit at such time. Also, in such applications, only relatively low magnitudes of signal current are required to operate the switching circuits 21, 21' as previously explained.

What is claimed is:
 1. A circuit for turning-off a gate-turn-off controlled rectifier having a gate electrode, and having a main current path connected between a first terminal for receiving an operating voltage and a second terminal for receiving a reference voltage, comprising:
 a third terminal for receiving turn-off signals;
 first transistor means having a main current path connected between said gate electrode and said second terminal, and having a control electrode;
 second transistor means having a main current path connected between said gate electrode and said control electrode of said first transistor means, and having a control electrode;
 first biasing means for supplying current from said third terminal to the control electrode of said second transistor means in response to each one of said turn-off signals, said second transistor means responding to the current supplied to its control electrode by lowering the relative impedance of its main current path to conduct current to the control electrode of said first transistor means, said first transistor means responding to the current supplied to its control electrode by lowering the impedance of its main current path to conduct a predetermined limited magnitude of current from said main current path of the gate-turn-off controlled rectifier through said gate electrode thereof; and
 second biasing means for supplying current from said third terminal to the control electrode of said first transistor means in response to each one of said turn-off signals, said first transistor means responding to current from said third terminal to maintain conduction through its main current path when the voltage drop across its main current path is insufficient to maintain said second transistor means in conduction, said first transistor means thereby acting to further reduce the voltage drop between said gate electrode and the second terminal and completing the turn-off of said gate-turn-off rectifier.

2. The circuit of claim 1, wherein said first transistor means corresponds to a first bipolar transistor having a collector electrode connected to said gate electrode, having an emitter electrode connected to said second terminal, and having a base electrode serving as its control electrode.

3. The circuit of claim 2, wherein said second transistor means corresponds to a second bipolar transistor having a collector electrode connected to said gate electrode, having an emitter electrode connected to the base electrode of said first transistor, and having a base electrode serving as its control electrode.

4. The circuit of claim 2 wherein said first biasing means includes resistor means.

5. The circuit of claim 3, wherein said second biasing means includes resistor means.

6. A circuit for turning-off a gate-turn-off controlled rectifier having a gate electrode, and having a main current path connected between a first terminal for receiving an operating voltage and a second terminal for receiving a reference voltage, comprising:
 a third terminal for receiving turn-off signals;
 a first bipolar transistor having a collector electrode connected to said gate electrode, having an emitter electrode connected to said second terminal and having a base electrode;

a second bipolar transistor having a collector-electrode connected to said gate electrode, having an emitter electrode connected to the base electrode of said first transistor, and having a base electrode;

first biasing means for supplying current from said third terminal to the base electrode of said second transistor in response to each one of said turn-off signals, said second transistor responding to current supplied to its base electrode by lowering the relative impedance between its collector and emitter electrodes to conduct current to the base electrode of said first transistor, said first transistor responding to current supplied to its base electrode by lowering the impedance between its collector and emitter electrodes to conduct a predetermined limited magnitude of current from the main current path of the gate-turn-off controlled rectifier through said gate electrode thereof;

second biasing means for supplying current from said third terminal to the base electrode of said first transistor in response to each one of said turn-off signals, said first transistor responding to current from said third terminal to maintain conduction between its collector and emitter electrodes when the voltage drop across its collector and emitter is sufficient to maintain said second transistor in conduction, said first transistor thereby acting to further reduce the voltage drop between said gate electrode and the second terminal, and completing the turn-off of said gate-turn-off rectifier; and a diode connected between the base electrode of said first transistor and the emitter electrode of said second transistor, and poled for blocking the flow of current from said second biasing means to the emitter electrode of said second transistor.

7. A circuit for turning-off a gate-turn-off controlled rectifier having a gate electrode, and having a main current path connected between a first terminal for receiving an operating voltage and a second terminal for receiving a reference voltage, comprising:

a third terminal for receiving turn-off signals;

a first bipolar transistor having a collector electrode connected to said gate electrode, having an emitter electrode connected to said second terminal and having a base electrode;

a second bipolar transistor having a collector electrode connected to said gate electrode, having an emitter electrode connected to the base electrode of said first transistor, and having a base electrode;

first biasing means for supplying current from said third terminal to the base electrode of said second transistor in response to each one of said turn-off signals, said second transistor responding to current supplied to its base electrode by lowering the relative impedance between its collector and emitter electrodes to conduct current to the base electrode of said first transistor, said first transistor responding to current supplied to its base electrode by lowering the impedance between its collector and emitter electrodes to conduct a predetermined limited magnitude of current from the main current path of the gate-turn-off controlled rectifier through said gate electrode thereof;

second biasing means for supplying current from said third terminal to the base electrode of said first transistor in response to each one of said turn-off signals, said first transistor responding to current from said third terminal to maintain conduction between its collector and emitter electrodes when the voltage drop across its collector and emitter is sufficient to maintain said second transistor in conduction, said first transistor thereby acting to further reduce the voltage drop between said gate electrode and the second terminal, and completing the turn-off of said gate-turn-off rectifier; and a diode connected between the collector of said second transistor and said gate electrode, and poled for blocking the flow of current from the base of said second transistor to the collector of said first transistor when the base-collector junction of said second transistor becomes forward biased.

8. A multi-state switching circuit, comprising:

a first terminal for receiving current;

a second terminal for receiving a reference voltage;

a third terminal for receiving control signals;

first transistor means for selectively completing a first conduction path between said first and second terminals in response to current flow through a control electrode thereof;

second transistor means for selectively completing a second conduction path between said first terminal and said control electrode of said first transistor means in response to current flow through a control electrode thereof first biasing means for supplying current from said third terminal to the control electrode of said second transistor means in response to each one of said control signals, said second transistor means responding to current supplied to its control electrode by lowering the relative impedance of said second conduction path to conduct current to the control electrode of said first transistor means, said first transistor means responding to current supplied to its control electrode by lowering the impedance of said first conduction path to conduct a predetermined limited magnitude of current from said first terminal; and second biasing means for supplying current from said third terminal to the control electrode of said first transistor means in response to each one of said control signals, said first transistor means responding to current from said third terminal to maintain conduction through said first conduction path when the voltage drop across that path is insufficient to maintain said second transistor means in conduction, said first transistor means thereby acting to further reduce the voltage drop between said first and second terminals.

9. The multi-state switching circuit of claim 8, wherein said second transistor means includes a bipolar transistor having a collector electrode connected to said first terminal, an emitter electrode connected to the control electrode of said first transistor means, and a base electrode as said control electrode.

10. The multi-state switching circuit of claim 8, wherein said first transistor means includes a bipolar transistor having a collector electrode connected to said first terminal, an emitter electrode connected to said second terminal, and a base electrode as said control electrode.

11. The multi-state switching circuit of claim 9, further including a diode connected between said emitter electrode and the control electrode of said first transistor means, poled for blocking the flow of current from said third terminal to said emitter electrode.

12. The multi-state switching circuit of claim 9, further including a diode connected between said collector electrode and said first terminal, poled for blocking the flow of current from said collector electrode to said first conduction path.

* * * * *